(12) United States Patent
Huai et al.

(10) Patent No.: US 11,678,586 B2
(45) Date of Patent: Jun. 13, 2023

(54) MEMORY SYSTEM HAVING THERMALLY STABLE PERPENDICULAR MAGNETO TUNNEL JUNCTION (MTJ) AND A METHOD OF MANUFACTURING SAME

(71) Applicants: Yiming Huai, Pleasanton, CA (US); Yuchen Zhou, San Jose, CA (US); Jing Zhang, Los Altos, CA (US); Roger Klas Malmhall, San Jose, CA (US); Ioan Tudosa, Milpitas, CA (US); Rajiv Yadav Ranjan, San Jose, CA (US)

(72) Inventors: Yiming Huai, Pleasanton, CA (US); Yuchen Zhou, San Jose, CA (US); Jing Zhang, Los Altos, CA (US); Roger Klas Malmhall, San Jose, CA (US); Ioan Tudosa, Milpitas, CA (US); Rajiv Yadav Ranjan, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 879 days.

(21) Appl. No.: 13/737,897

(22) Filed: Jan. 9, 2013

(65) Prior Publication Data

US 2013/0119498 A1 May 16, 2013
US 2019/0148622 A9 May 16, 2019

Related U.S. Application Data

(60) Division of application No. 13/277,187, filed on Oct. 19, 2011, now abandoned, which is a continuation of
(Continued)

(51) Int. Cl.
*H10N 50/80* (2023.01)
*G11C 11/16* (2006.01)
(Continued)

(52) U.S. Cl.
CPC ............ *H10N 50/80* (2023.02); *G11C 11/161* (2013.01); *H10N 50/01* (2023.02); *H10N 50/10* (2023.02);
(Continued)

(58) Field of Classification Search
CPC ......... H01L 43/12; H01L 43/02; G11C 15/02; G11C 11/161; H01F 10/32222;
(Continued)

(56) References Cited

U.S. PATENT DOCUMENTS

2004/0071923 A1* 4/2004 Fullerton et al. ............ 428/65.3
2005/0185455 A1* 8/2005 Huai .................... B82Y 25/00
365/171
(Continued)

*Primary Examiner* — Tabassom Tadayyon Eslami
(74) *Attorney, Agent, or Firm* — Bing K. Yen

(57) ABSTRACT

A spin-transfer torque magnetic random access memory (STTMRAM) element employed to store a state based on the magnetic orientation of a free layer, the STTMRAM element is made of a first perpendicular free layer (PFL) including a first perpendicular enhancement layer (PEL). The first PFL is formed on top of a seed layer. The STTM-RAM element further includes a barrier layer formed on top of the first PFL and a second perpendicular reference layer (PRL) that has a second PEL. The second PRL is formed on top of the barrier layer. The STTMRAM element further includes a capping layer that is formed on top of the second PRL.

13 Claims, 7 Drawing Sheets

Related U.S. Application Data application No. 12/965,733, filed on Dec. 10, 2010, now Pat. No. 8,623,452, and a continuation-in-part of application No. 12/641,244, filed on Dec. 17, 2009, now Pat. No. 8,593,862, which is a continuation-in-part of application No. 11/776,692, filed on Jul. 12, 2007, now Pat. No. 8,063,459, and a continuation-in-part of application No. 11/739,648, filed on Apr. 24, 2007, now Pat. No. 8,183,652, and a continuation-in-part of application No. 11/674,124, filed on Feb. 12, 2007, now Pat. No. 8,084,835.

(60) Provisional application No. 61/483,314, filed on May 6, 2011, provisional application No. 61/138,493, filed on Dec. 17, 2008.

(51) Int. Cl.
*H10N 50/01* (2023.01)
*H10N 50/10* (2023.01)

(52) U.S. Cl.
CPC ..... *Y10T 428/1107* (2015.01); *Y10T 428/1114* (2015.01)

(58) Field of Classification Search
CPC . H01F 10/32; G11B 5/3153; Y10T 428/1107; Y10T 428/114
USPC .......... 428/811.11, 811, 811.1, 819.4, 820.1, 428/828; 257/421; 360/328
See application file for complete search history.

(56) References Cited

U.S. PATENT DOCUMENTS

| | | | |
|---|---|---|---|
| 2005/0213262 A1* | 9/2005 | Miyauchi et al. | 360/324.1 |
| 2006/0245116 A1* | 11/2006 | Klostermann | G11C 11/15 360/324.2 |
| 2007/0086121 A1* | 4/2007 | Nagase | B82Y 25/00 360/324.1 |
| 2007/0188942 A1* | 8/2007 | Beach | G01R 33/09 360/324.2 |
| 2008/0080101 A1* | 4/2008 | Mauri et al. | 360/324.2 |
| 2008/0174921 A1* | 7/2008 | Ikarashi et al. | 360/320 |
| 2009/0080239 A1* | 3/2009 | Nagase | H01L 27/228 365/158 |
| 2010/0096716 A1* | 4/2010 | Ran | B82Y 10/00 257/421 |
| 2010/0230770 A1* | 9/2010 | Yoshikawa | H01L 27/228 257/421 |
| 2010/0297475 A1* | 11/2010 | Kawakami | H01L 43/08 428/811.1 |
| 2011/0031569 A1* | 2/2011 | Watts et al. | 257/421 |
| 2011/0064969 A1* | 3/2011 | Chen | B82Y 25/00 428/800 |
| 2011/0096443 A1* | 4/2011 | Zhang et al. | 360/324.2 |
| 2011/0171493 A1* | 7/2011 | Worledge et al. | 428/800 |
| 2012/0063218 A1* | 3/2012 | Huai et al. | 365/171 |
| 2012/0069640 A1* | 3/2012 | Nagase | H01L 43/08 365/158 |
| 2012/0261777 A1* | 10/2012 | Shukh | H01L 43/08 257/421 |
| 2012/0280336 A1* | 11/2012 | Jan et al. | 257/421 |
| 2013/0032911 A1* | 2/2013 | Jung | H01L 43/08 257/421 |

* cited by examiner

MEMORY SYSTEM HAVING THERMALLY STABLE PERPENDICULAR MAGNETO TUNNEL JUNCTION (MTJ) AND A METHOD OF MANUFACTURING SAME

CROSS REFERENCE TO RELATED APPLICATIONS

This application is a divisional of U.S. patent application Ser. No. 13/277,187, filed on Oct. 19, 2011, by Yiming Huai, et al., and entitled "Memory System Having Thermally Stable Perpendicular Magneto Tunnel Junction (MTJ) and a Method of Manufacturing Same", which claims priority to U.S. Provisional Application No. 61/483,314 and is a continuation of U.S. patent application Ser. No. 12/965,733, filed on Dec. 10, 2010, by Zhou et al., and entitled "Enhanced Magnetic Stiffness and Method of Making Same", now U.S. Pat. No. 8,623,452.

BACKGROUND OF THE INVENTION

1. Field of the Invention

The present invention relates generally to a memory system having spin transfer torque (STT) switched magneto tunnel junctions (MTJs) and more particularly, a method to reduce the effective damping of magnetic layer and increase tunneling magneto-resistive ratio (TMR), and a method and apparatus for improving the perpendicular anisotropy and thermal stability of the low switching current perpendicular magneto tunnel junctions (pMTJs).

2. Description of the Prior Art

Spin transfer torque magnetic random access memory (STTMRAM) is the next generation of non-volatile memory currently under development. Such a memory typically includes magneto (sometimes referred to as "magnetic") tunnel junction (MTJ) based memory array with selection device, along with decoders, amplifier and other peripheral circuits. MTJ is considered as a building block for STT MRAM. A MTJ typically composed of two ferromagnetic layers separated by a thin insulating tunneling barrier. MTJ exhibits a low (high) resistance state when the magnetization orientation of the two ferromagnetic layers in substantially parallel (anti-parallel) direction. In STT-MRAM, these low and high resistance states (corresponding to "0" and "1" digital state) are realized by applying a bi-directional electric current across MTJ during programming, in contrast to conventional MRAM where these low and high resistance magnetic states (bits) are programmed by using a current-generated external magnetic field.

STTMRAM has significant advantages over magnetic-field-written MRAM, which has been recently commercialized. The main hurdles associated with field-switched-MRAM are its more complex cell architecture with high write current [currently in the order of milliamps (mA)] and poor scalability (limited to 65 nm process node) attributed to its inherent field write scheme used in these devices. The current generated fields needed to write the bits increase rapidly as the size of the MTJ elements shrink. STT writing technology, by directly passing a current through the MTJ, overcomes the foregoing hurdles and results in much lower switching current [in the order of microamps (µA)], simpler cell architecture with a smaller cell size (for single-bit cells) and reduced manufacturing cost, and more importantly, improved scalability.

One of the challenges for implementing STT is a substantial reduction of the intrinsic current density to switch the magnetization of the free layer while maintaining high thermal stability, which is required for long-term data retention. Minimal switching (write) current is required mainly for reducing the size of access transistor of the memory cell, which is typically connected in series with MTJ, because the channel width of the transistor is proportional to the drive current of the transistor. It is understood that the smaller the STT current, the smaller the transistor size, leading to a smaller memory cell size. A smaller current also leads to smaller voltage across MTJ, which decreases the probability of tunneling barrier degradation and breakdown, ensuring a high write endurance of the MTJ cell. This is particularly important for STTMRAM, because current is driven through MTJ cells during both read and write operations.

One of the efficient ways to reduce the programming current in STTMRAM while maintaining high magnetic thermal stability is to use a MTJ with perpendicular anisotropy. Incorporation of conventional perpendicular anisotropy materials, such as FePt, into STTMRAM causes a high damping constant leading to undesirably high switching current density. Furthermore, during manufacturing, conventional higher ordering transformation temperature required for forming L10 ordered structure could degrade the tunneling magneto-resistance (TMR) performance and make MTJ deposition process more demanding and complicated (such as elevated substrate temperatures during MTJ film deposition).

What is needed is a STTMRAM element having a MTJ with perpendicular magnetic anisotropy material(s) with a simple film manufacturing process, preferably, at room substrate temperature and an optimal combination of saturation magnetization (Ms) and anisotropy constant (Ku) to lower the damping constant of the MTJ yielding a lower STT switching current density while maintaining high thermal stability and high TMR performance.

SUMMARY OF THE INVENTION

Briefly, a spin transfer torque magnetic random access memory (STTMRAM) element and a method of manufacturing the same is disclosed where the STTMRAM element is employed to store a state based on the magnetic orientation of a free layer, and made of a first perpendicular free layer (PFL) including a first perpendicular enhancement layer (PEL). The first PFL is formed on top of a seed layer. The STTMRAM element further includes a barrier layer formed on top of the first PFL and a second perpendicular reference layer (PRL) that has a second PEL. The second PRL is formed on top of the barrier layer. The STTMRAM element further includes a capping layer that is formed on top of the second PRL.

Additionally, this invention describes a method to reduce damping and increase stiffness in the magnetic layers of STTMRAM and simultaneously achieving higher TMR, which is applicable to both in-plane MTJs and pMTJs.

These and other objects and advantages of the present invention will no doubt become apparent to those skilled in the art after having read the following detailed description of the various embodiments illustrated in the several figures of the drawing.

IN THE DRAWINGS

DETAILED DESCRIPTION OF THE PREFERRED EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1:
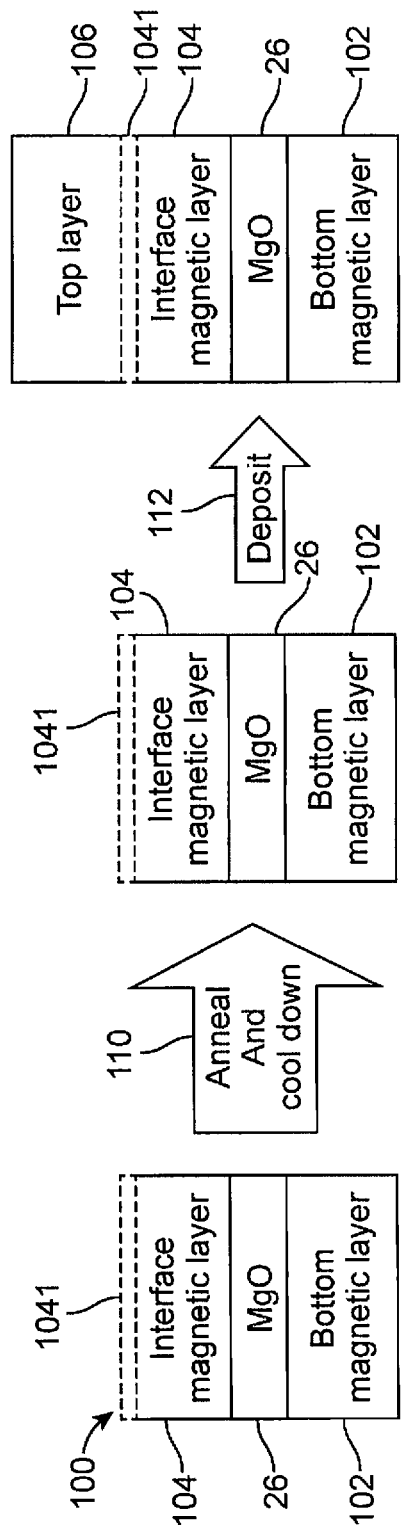
FIG. 1 shows the process of enhancing the top magnetic layer of a STTMRAM 100, using a method of the present invention.

FIG. 1 shows relevant layers of a STTMRAM element 100, in accordance with an embodiment of the invention. The element 100 is also referred to herein as a STTMRAM MTJ film stack. The element 100 is shown to include a bottom magnetic layer (BML) 102 formed below the layer 26 and an interface magnetic layer (IML) 104 formed on top of the layer 26. The following process is performed when making the element 100. The layer 26 and the layer 104 collectively comprise at least part of the MTJ of the element 100.

Upon depositing the layer 104 on top of the layer 26, which includes deposition of a top surface layer 1041 which is part of layer 104, the temperature (also referred to herein as "first temperature") being applied to the element 100 is increased followed by annealing at 110, preferably in-situ within the same deposition system without breaking the vacuum to avoid oxidization and contamination of the top surface layer of 104. Still at 110, in FIG. 1, the temperature being applied to the element 100 is reduced (the reduced temperature is also referred to herein as the "second temperature") and the remaining layers, i.e. top layer 106, are deposited on top of the layer 104. After depositing the layer 106, optionally, a second annealing process is performed at a temperature that is higher than the second temperature.

Each of the layers 102 and 104 can have an in-plane or a perpendicular magnetization relative to the film plane. In some embodiments, the layer 106 is made of magnetic material, in other embodiments, it is made of non-magnetic material and in still other embodiments, it is interlaced with magnetic and non-magnetic materials. In some embodiments, the layer 104 is composed of a multilayer structure with magnetic layer and non-magnetic layer where at least one of these magnetic layers interfaces with the layer 26. In some embodiments, the layer 104 is composed of a multi-layer structure with magnetic layer and non-magnetic layer where at least one of these non-magnetic layers forms the top surface of layer 106, which can be any combination of, but not limited to, Ta, Pd, Ru, Mg, O, Hf, Tb, Pt, Ti, Cu, or Hf. In some embodiments, the layer 104 is made of a multilayer structure including at least one magnetic layer and at least one non-magnetic layer where at least one of these magnetic layers forms the top surface of the layer 106, and made of any combination, but not limited to, the following materials: Co, Fe, B, Ni, Ta, Pd, Ru, Mg, O, Tb, Pt, Ti, Cu, Zr, Mn, Ir, or Hf.

The layer 102, in some embodiments, is made of underlying magnetic or non-magnetic layers that are not shown in FIG. 1. In some embodiment, the layer 104 and the layer 102 each have boron content, and either one or both are made of a single composition magnetic layer or have a multilayer structure with each layer of the multi-layer having a distinct boron content, ranging from 0~90% of the composition of the layer 104. In some embodiments, the layers 102 and 104 are each composed of boron (B) with any combination of the following materials: Co, Fe, Ta, Ti, Ni, Cr, Pt, Pd, Tb, Zn, O, Cu or Zr.

Figure 2:
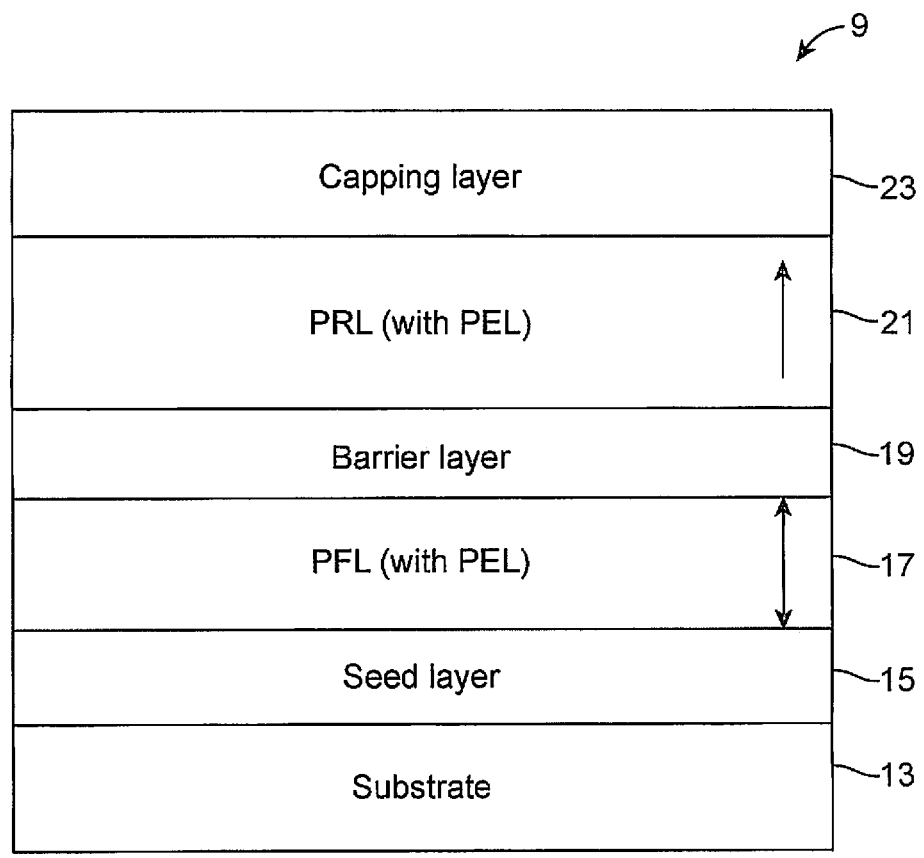
FIG. 2 shows a spin-transfer torque magnetic random access memory (STTMRAM) element 9, in accordance with an embodiment of the present invention.

FIG. 2 shows a spin-transfer torque magnetic random access memory (STTMRAM) element 9, in accordance with an embodiment of the present invention. The element 9 is shown to include a seed layer 15 shown formed on top of a substrate 13 and a perpendicular free layer (PFL) 17 formed on top of the seed layer 15 and a barrier layer 19 formed on top of the PFL 17 and a perpendicular reference layer (PRL) 21 formed on top of the barrier layer 19 and a capping layer 23 formed on top of the PRL 21. As will become evident shortly, the PFL 17 and the PRL 21 each include at least a perpendicular enhancement layer (PEL) for improving the perpendicular anisotropy of the PRL 21 and the PFL 17.

The PRL 21 is analogous to the layer 104 combined with layer 106 of FIG. 1, where PEL of layer PRL 21 is analogous to the top surface layer 1041 of FIG. 1.

Exemplary materials of which the seed layer 15 is made are: tantalum (Ta), titanium (Ti), chromium (Cr), ruthenium (Ru), nickel chromium (NiCr), titanium chromium (TiCr), or MgO. In some of the embodiments where the layer 15 is made of ruthenium (Ru), layer 15 has a thickness of 1 nm to 10 nm. In some of the embodiments where the layer 15 is made of MgO, layer 15 has a thickness of 0.3 nm to 0.7 nm. Exemplary stack of the PFL 17 is composed of perpendicular ferromagnetic layers and PEL. Exemplary materials of which the PEL is made are tantalum (Ta), titanium (Ti), hafnium (Hf), niobium (Nb), vanadium (V), yttrium (Y), rhenium (Re), tungsten (W), chromium (Cr), molybdenum (Mo), and ruthenium (Ru). It is well known that the barrier layer 19 is typically made of magnesium oxide (MgO) or aluminum oxide (Al2O3). The PRL 21, in some embodiments, is a synthetic anti-ferromagnetic (SAF) pinned layer, composed of two antiferromagtically coupled perpendicular ferromagnetic layers separated by a non-magnetic exchange coupling layer. The capping layer 23 is made of Ta, Ru, Hf, Ti, or MgO in some embodiments of the present invention.

Figure 7:
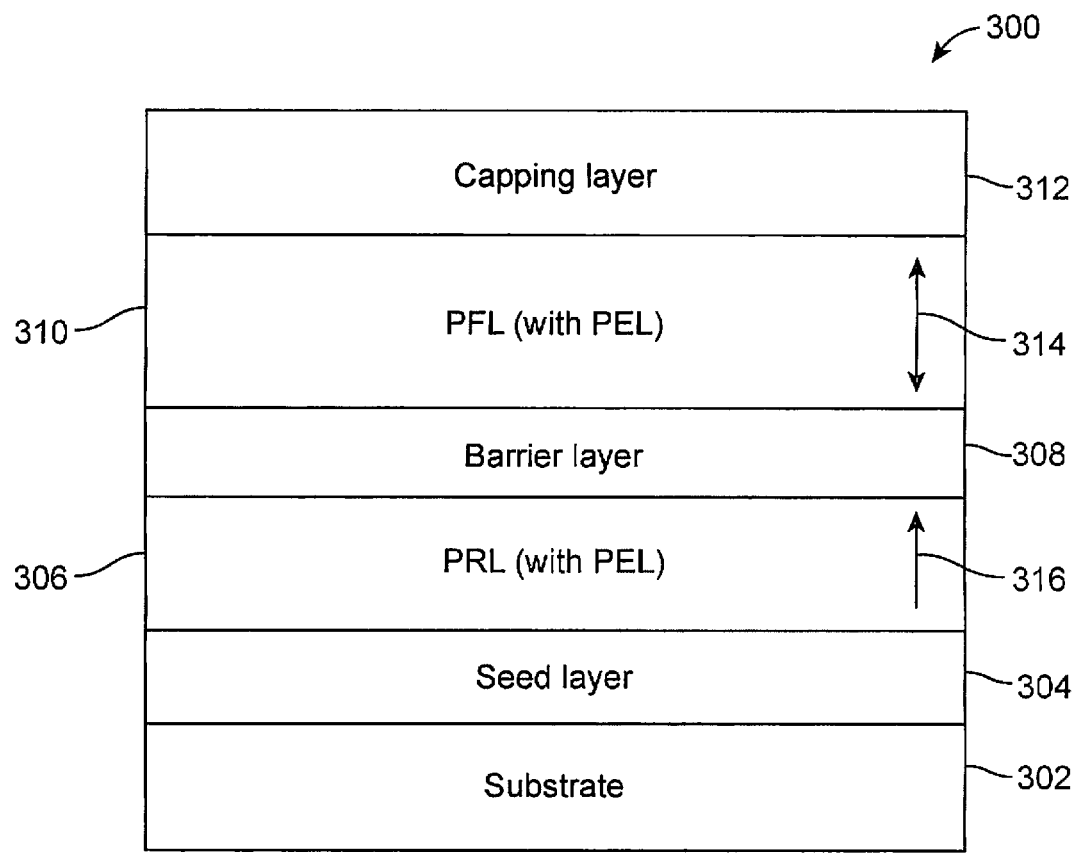
FIG. 7 shows a STTMRAM element 300, in accordance with yet another embodiment of the present invention.

The element 9 has a top structure defined by the PRL 21 being above the PFL 17. That is, the PRL 21 is essentially the "reference layer" (also referred to as the "pinned layer" or "fixed layer") with a fixed magnetic orientation perpendicular to the film plane and the PFL 17 is essentially the "free layer" (also referred to as the "switching layer") with a switchable perpendicular magnetic orientation that switches relative to the magnetic orientation of the PRL 21. A bottom structure configuration of the element 9 would have the PFL 17 formed above the PRL 21 (as shown in FIG. 7).

As noted by the direction of the arrows in the PFL 17 and the PRL 21, the anisotropy of each of the PFL 17 and PRL 21 is perpendicular to the plane of the substrate 13.

Largely due to presence of the PFL 17 with PEL, the element 9 advantageously exhibits an improved perpendicular anisotropy.

Figure 3:
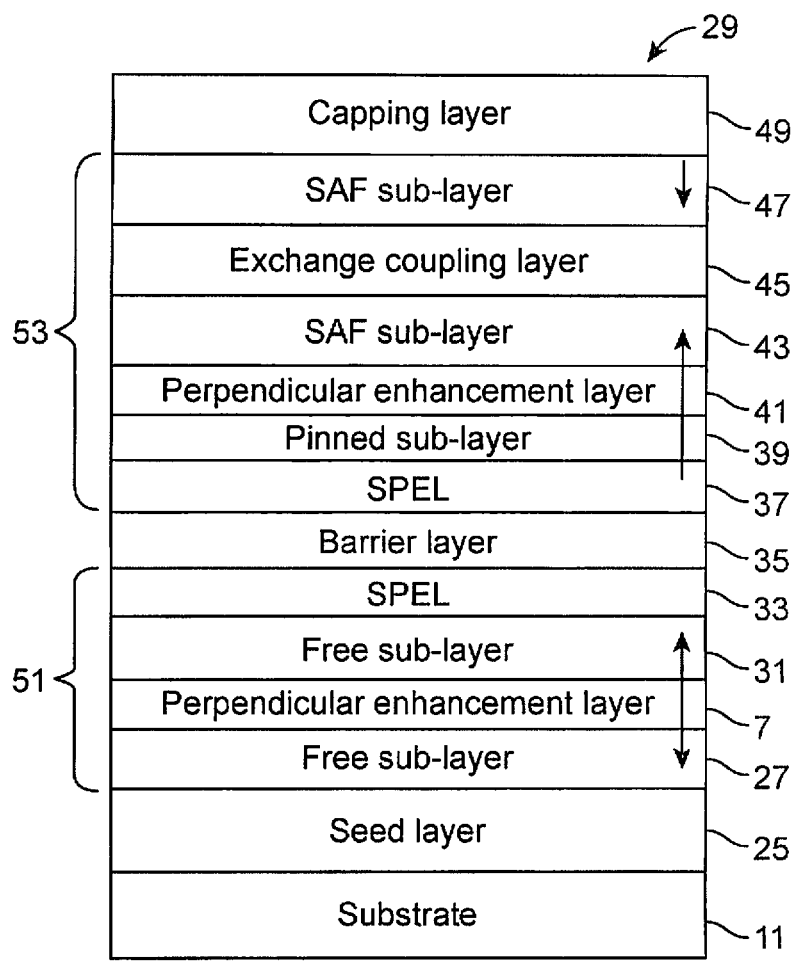
FIG. 3 shows the STTMRAM element 29, in accordance with another embodiment of the present invention.

FIG. 3 shows the STTMRAM element 29, in accordance with another embodiment of the present invention. The element 29 is shown to include a substrate 11 on top of which is shown formed a seed layer 25 on top of which is shown formed a free sub-layer 27 on top of which is shown formed a perpendicular enhancement layer (PEL) 7 on top of which is shown formed a free sub-layer 31 on top of which is shown formed a spin polarization enhanced (interface) layer (SPEL) 33 on top of which is shown formed a barrier layer 35 on top of which is shown formed SPEL 37 on top of which is shown formed a pinned sub-layer 39 on top of which is shown formed a PEL 41 on top of which is shown formed a synthetic anti-ferromagnetic (SAF) sub-layer 43 on top of which is shown formed an exchange coupling layer 45 on top of which is shown formed a SAF sub-layer 47 on top of which is shown formed a capping layer 49. The PEL layers 7 and 41 enhance magnetic coupling between perpendicular ferromagnetic layers in the PFL 51 and PRL 53, through direct magnetic coupling, or/and magneto static coupling or/and interlayer exchange coupling. The enhanced coupling can be also attributed in some embodiments to improved crystalline structures of the PFL 51 and PRL 53 due to the presence of PEL layers 7 and/or 41. In some embodiments, the PEL 7 and 41 have a thickness of 2 to 10 Angstroms.

The substrate 11 is analogous to the substrate 13 and the layer 49 is analogous to the layer 23 of the element 9. In some embodiments, the layer 25 is made of Ta, Ti, Pt, Pd, TiCr, NiCr, Ru, or MgO. In some of the embodiments where the layer 25 is made of ruthenium (Ru), layer 25 has a thickness of 1 nm to 10 nm. In some of the embodiments the layer 25 is made of MgO and has a thickness of 0.3 nm to 0.7 nm. The free sub-layer 27 is made of the alloy cobalt-iron-boron (CoFeB) with the atomic percentage of the iron being greater than 20%. In some embodiments, the sub-layer 31 is made of the alloy cobalt-iron-boron (CoFeB) with the atomic percentage of Fe being greater than 40% and boron being within a range of 20 to 30 atomic percent. The layer 35 is analogous to the layer 19.

In some embodiments, the layer 25 is 10-100 Angstroms in thickness.

The free sub-layers 27 and 31 and the PFL layer 7 and the SPEL 33 collectively comprise the free layer PFL 51 and the SPEL 37, pinned sub-layer 39, PEL 41, SAF sub-layer 43, layer 45, and the SAF sub-layer 47 comprise the synthetic antiferromagnetic perpendicular reference layer (SAF PRL) 53, also commonly referred to as "synthetic reference layer" (SRL) 53, which remains fixed in its magnetic orientation after manufacturing of the element 29 whereas the free layer 51 switches its magnetic orientation relative to the magnetic orientation of the SRL 53 when the element 29 is used as a storage element.

It is noted that the layer 35 is commonly referred to as the "tunnel layer" or "tunneling layer" and the layer 49 is commonly referred to as the "cap layer". The layer 51, the layer 35 and the SAF PRL 53 collectively comprise the MTJ of the element 29.

The function of each of the SPEL 33 and 37 is to enhance the tunneling magneto-resistance (TMR) of the MTJ through proper crystal structure orientation [bcc (001)] matching during the magnetic annealing process and higher spin polarization.

The function of the layer 35 is to act as spin-filter layer for preserving the spin generated by neighboring layers for the spin tunneling of the MTJ which is important in achieving high TMR. More specifically, the layer 35 selectively filters the spin states of the polarized conduction electrons as they travel through the SRL 53 to the free layer 51 and vice versa. A detailed description of this can be found in the published paper, "Theory of Tunneling Magnetoresistance For Epitaxial Systems by W. H. Butler, X. G. Zhang, S. Vutukuri, M. Chchiev and T. C. Schulthess, IEEE Trans Mag., vol. 41, No. 10, October 2005".

The function of each of the free layer 51 is to switch between magnetic orientations (states) when current is applied to the element 29 thereby storing a state. The design and the material of choice used for making the free layer determines, at least in part, the device reliability, more specifically the thermal stability. The presence of the PEL 41 improves the perpendicular anisotropy of the SRL 53 of the element 29. The PEL 41 helps the perpendicular coupling between SAF sub layer 43 and pinned sub layer 39 by direct magnetic coupling, or/and magneto static coupling or/and interlayer exchange coupling. The enhanced coupling can be also attributed in some embodiments to improved crystalline structures of the PFL 51 and PRL 53 due to the presence of PEL layers 7 and 41.

It is noted that the SAF sub-layer 43 and the SAF sub-layer 47 are anti-ferromagnetically coupled.

The anisotropy of the free layer 51 and the SAF PRL 53 is generally and substantially perpendicular to the plane of the substrate 11. In operation, current is applied to the element 29, in a direction going either from the substrate 11 to the layer 49 or from the layer 49 to the substrate 11.

In some embodiments, the SPEL 37 is made of the alloy CoFe with the atomic percentage of Fe being greater than 80% and the pinned sub-layer 39 is made of CoFeB with Fe having an atomic percentage of greater than 40 and B having an atomic percentage between 20 and 30, including 20 and 30. In some embodiments, the sub-layer 43 is made of a cobalt (Co) and/or chromium (Cr) based alloy, such as CoCrPt, CoCrTa, CoCrPd, CoTi, CoNiSm, CoCrTi, CoCrZr, CoCrAl, CoCrSi, CoSm, CoCrPt:SiOx, CoCrPd:SiOx where SiOx can be replaced with any one of the following material: TiOx, ZrOx and CrOx. The sub-layer 47 is made of the same material as that of the sub-layer 43. In some embodiments, the layer 45 is made of ruthenium (Ru), iridium (Ir), or copper (Cu).

The sub-layer 43 with strong perpendicular anisotropy can be deposited on other layers in a vacuum system by physical sputtering technique on a room-temperature substrate.

As shown by the arrows of FIG. 3, the direction of magnetization of the free layer 51 switches to store a different state, when the element 29 is in operation, but the direction of magnetization of the SRL 53 must remain fixed although the arrows therein show two opposite directions, one direction shown in the SPEL 37, sub-layer 39, PEL 41 and sub-layer 43 and an opposite direction shown in the layer 47. This so called anti-ferromagnetic coupling configuration is realized by interlayer exchange coupling through the thin layer 45. Due to the opposite magnetizations of these layers, the overall dipole magnetic fields from these two oppositely aligned magnetizations in the SRL 53 on the PFL 51 is substantially cancelled, enabling low power and symmetric current switching of PFL when the element 29 is in write operation.

In some embodiments of element 29, the free sub-layer 27 is formed on top of the seed layer 25 and underneath the PEL 7 and is made of a cobalt-chromium (CoCr)-based alloy, such as CoCrPt, CoCrTa, CoCrPd, CoTi, CoNiSm, CoCrTi, CoCrZr, CoCrAl, CoCrSi, CoSm, CoCrPt:SiOx, CoCrPd: SiOx where SiOx can be replaced with any one of the following material: TiOx, ZrOx and CrOx. The cobalt-chromium (CoCr)-based alloy of the free sub-layer 27 enhances the thermal reliability of the element 29.

The layers sub-layer 27, PEL 7, sub-layer 31 and SPEL 33 collectively form the free layer 51 of the element 29 and the SPEL 37, pinned sub-layer 39, PEL 41, sub-layer 43, layer 45 and sub-layer 47 collectively form the SAF PRL 53 of the element 29. Accordingly, the free layer 51, layer 35 and SAF PRL 53 form the MTJ of the element 29.

Figure 4:
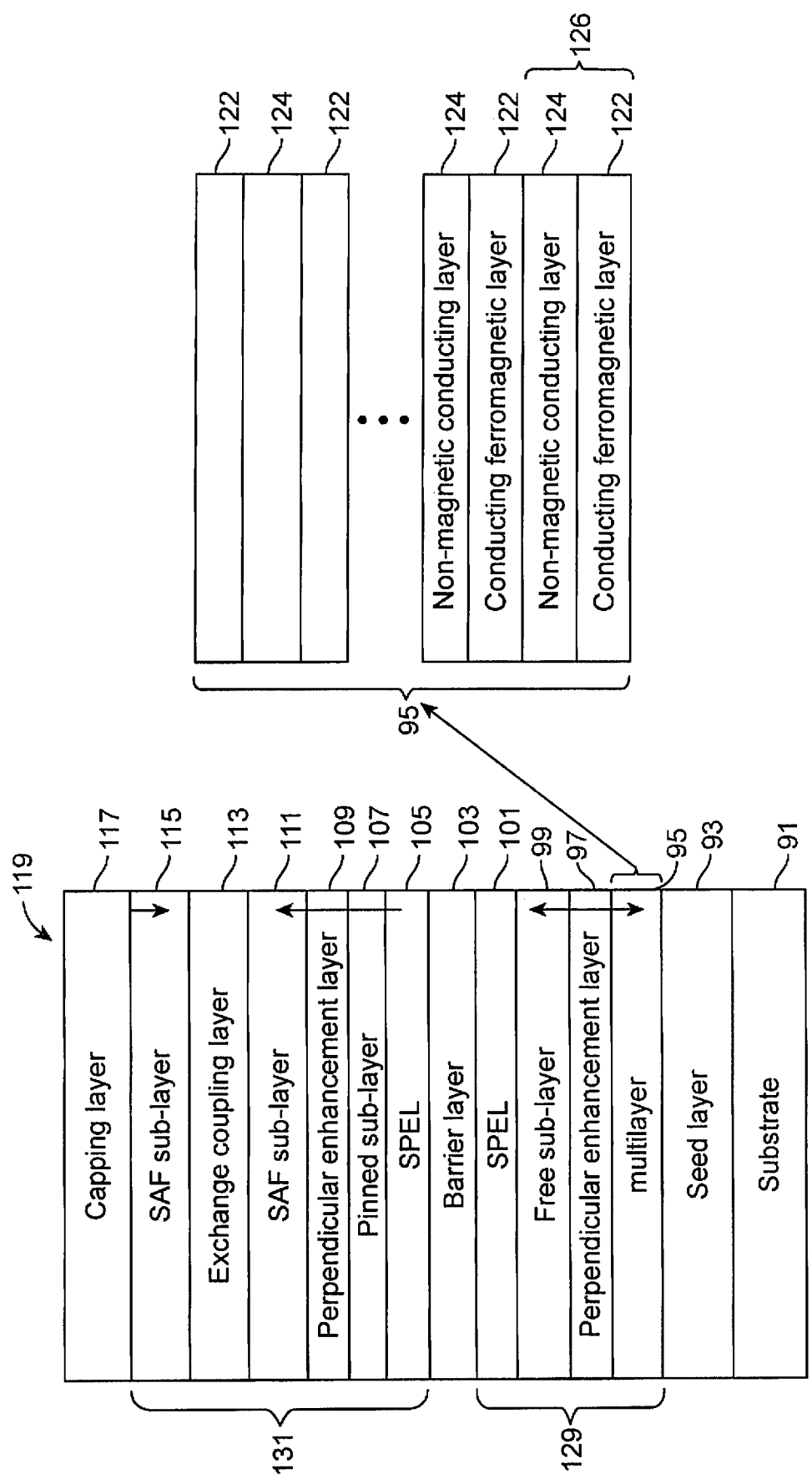
FIG. 4 shows a STTMRAM element 119, in accordance with another embodiment of the present invention.

FIG. 4 shows a STTMRAM element 119, in accordance with another embodiment of the present invention. The element 119 is analogous to the element 29 except that the multi-layer 95 of the element 119 replaces the layer 27 of the element 29. Otherwise, all other layers of the element 119 are analogous to corresponding layers of the element 29.

The multi-layer 95 is a part of the layers of the free layer 129 of the element 119 in addition to the PEL 97, the free sub-layer 99 and the SPEL 101. The SAF PRL 131 of the element 119 is comprised of the SPEL 105, the sub-layer 107, the PEL 109, the SAF sub-layer 111, the exchange coupling layer 113 and the SAF sub-layer 115.

In some embodiments, the multi-layer 95 is made of one or more bilayers, with each bilayer 126 comprised of a conducting ferromagnetic layer 122 and a non-magnetic conducting layer 124. In some embodiments, the layer 122 is formed on top of the layer 124, and in some embodiments, the layer 124 is formed on top of the layer 122. The multi-layer 95 finished by the conducting magnetic layer 122 adjacent to the PEL layer 97. The 'n' number of bilayers 126 comprises the layer 95 with 'n' being an integer value plus an additional 122 layer on the top. In some embodiments, 'n' is equal to a number within the range of two to twenty.

In some embodiments, the layer 122 has a thickness within the range of 2 to 8 angstroms and the layer 124 has a thickness within the range of 2 to 20 angstroms.

In some embodiments, the layer 122 is made of one of the following materials: Co, Fe, Ni or their alloys, or CoFeXY with X and Y being made of boron (B), vanadium (V), chromium (Cr), tantalum (Ta) or niobium (Nb).

In some embodiments, the layer 124 is made of palladium (Pd) or platinum (Pt). Co/Pt and Co/Pd based perpendicular multilayers have advantages; it is easy to control their saturation magnetization Ms and perpendicular anisotropy Hk by adjusting bilayer number "n" and individual 122 and 124 layer thicknesses. Multilayers also have high corrosion resistance in the MTJ integration process. In addition, multilayers are comparatively easy to realize high perpendicular magnetic anisotropy on room temperature substrate in sputtering process, yet show high magnetic thermal stability.

Figure 5:
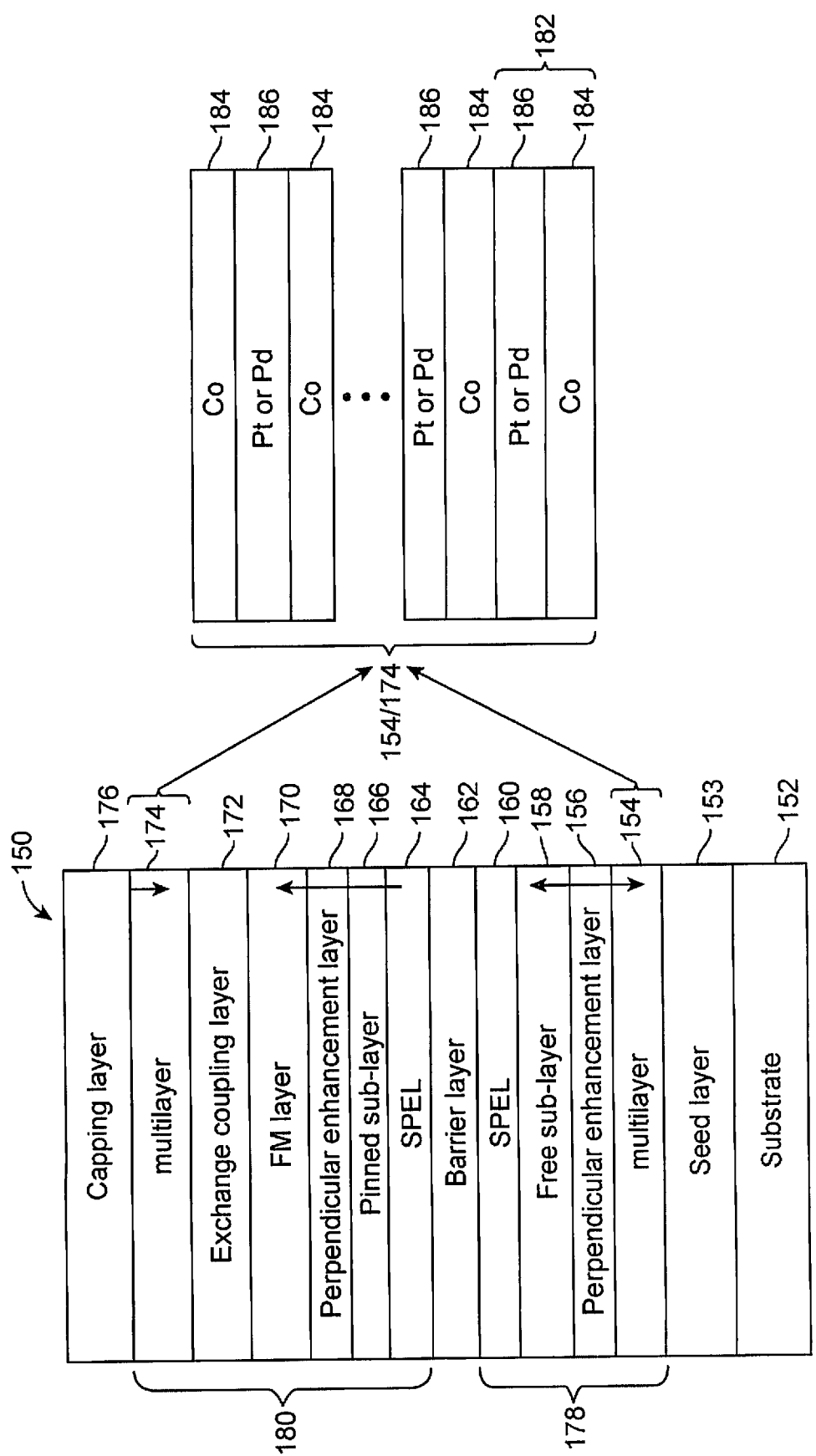
FIG. 5 shows a STTMRAM element 150, in accordance with yet another embodiment of the present invention.

FIG. 5 shows a STTMRAM element 150, in accordance with yet another embodiment of the present invention. The element 150 is analogous to the element 119 except that it has a multi-layer 174 replacing the layer 115 of the element 119. The multi-layer 174 is made of the same material and has the same structure as the layer 95. The layer 154 of the element 150 is also made of the same material as the layer 95 of the element 119 and is analogous to the layer 95. The layers 154 and 174 are each therefore made of 'n' number of bilayers 182 plus a Co layer on the top with each bilayer 182 being comprised of a conducting ferromagnetic layer 184, analogous to the layer 122, and a non-magnetic conducting layer 186, analogous to the layer 124.

The multi-layer 154, PEL 156, free sub-layer 158 and SPEL 160 collectively comprise the free layer 178 and the SPEL 164, the pinned sub-layer 166, the PEL 168, the SAF sub layer 170, the exchange coupling layer 172 and the multi-layer 174 collectively comprise the SAF PRL layer 180 with the layers 178, 162 and 180 forming the MTJ of the element 150.

Figure 6:
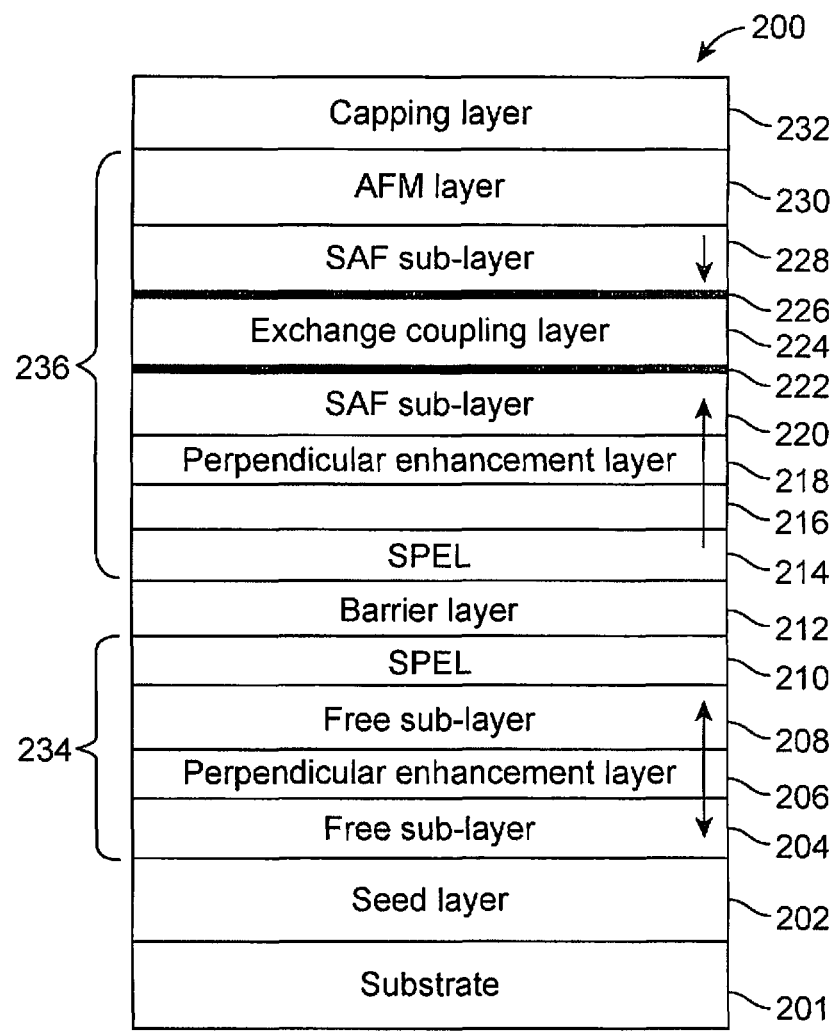
FIG. 6 shows a STTMRAM element 200, in accordance with another embodiment of the present invention.

FIG. 6 shows a STTMRAM element 200, in accordance with another embodiment of the present invention. The element 200 is analogous to the element 29 of FIG. 3 except that a thin insertion layer 222 is formed between the SAF sub-layer 220 and the exchange coupling layer 224 and another thin insertion layer 226 is formed between the exchange coupling layer 224 and the SAF sub-layer 228 and an anti-ferromagnetic (AFM) layer 230 is formed between the SAF sub-layer 228 and the capping layer 232. The SPEL 214, pinned sub-layer 216, layer 218, sub-layer 220, layer 222, layer 224, layer 226, SAF sub-layer 228 and layer 230 collectively form the synthetic pinned (or "reference") layer of the element 200.

The insertion layers 222 and 226, in some embodiments, are each made of cobalt and serve to enhance the RKKY coupling of the exchange coupling layer 224. The AFM layer 230 serves to enhance the pinning strength of the SAF PRL layer 236. The free sub-layer 204, the PEL 206, the free sub-layer 208 and the SPEL 210 collectively comprise the free layer of the element 200 and the SPEL 214, the pinned sub-layer 216, the PEL 218, the sub-layer 220, the layer 222, the exchange coupling layer 224, the layer 226, the sub-layer 228 and the AFM layer 230 comprise the SAF PRL 236.

In some embodiments, the layer 230 is made of one of the following materials: PtMn, FeMn or IrMn and each of the layers 222 and 226 is made of Co or Co rich alloys, such as CoFe.

It is understood that the embodiments of FIGS. 6-9 are top structures but in other embodiments, bottom structures of the same embodiments are contemplated where the free layer is formed above the SAF PRL, such as that PRL 306 shown in FIG. 7.

FIG. 7 shows a STTMRAM element 300, in accordance with another embodiment of the present invention. The element 300 is shown to include a substrate 302, seed layer 304, PRL 306, barrier layer 308, PFL 310 and capping layer 312. The seed layer 304 is shown formed on top of the substrate 302, the PRL 306 is shown formed on top of the seed layer 304, the barrier layer 308 is shown formed on top of the PRL 306, the PFL 310 is shown formed on top of the barrier layer 308 and the capping layer 312 is shown formed on top of the PFL 310. The element 300 is analogous to the element 9 except that it is a bottom structure in that the PRL is shown formed below the PFL 310. The PFL 310 is analogous to the PFL 17 and the PRL 306 is analogous to the PRL 21. The arrow 316 shows the direction of magnetization of the PRL 306 and the arrow 314 shows the alterable direction of magnetization of the PFL 310.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin-transfer torque magnetic random access memory (STTMRAM) element comprising:
   a free layer including:
      a first and a second free sub-layers having a variable magnetization direction substantially perpendicular to layer planes thereof; and a first perpendicular enhancement layer (PEL) interposed between the first and second free sub-layers;
a barrier layer formed adjacent to the free layer; and
a reference layer formed adjacent to the barrier layer opposite the free layer, the reference layer including:
a first and a second reference sub-layers having a first invariable magnetization direction;
a second PEL interposed between the first and second reference sub-layers;
an antiferromagnetic coupling layer formed adjacent to the second reference sub-layer opposite the second PEL; and
a third reference sub-layer formed adjacent to the antiferromagnetic coupling layer opposite the second reference sub-layer and having a second invariable magnetization direction that is substantially perpendicular to a layer plane of the third reference sub-layer and opposite to the first invariable magnetization direction,
wherein the first reference sub-layer comprises cobalt, iron, and boron.

2. The STTMRAM element, as recited in claim 1, wherein the free layer further includes a spin polarization enhanced layer (SPEL) in physical contact with the barrier layer and the first free sub-layer.

3. The STTMRAM element, as recited in claim 1, wherein the reference layer further includes a spin polarization enhanced layer (SPEL) in physical contact with the barrier layer and the first reference sub-layer comprising cobalt, iron, and boron.

4. The STTMRAM element, as recited in claim 1, wherein the first PEL is made of an elemental metal of molybdenum, tungsten, niobium, or yttrium.

5. The STTMRAM element, as recited in claim 1, wherein the first and second reference sub-layers are in physical contact with the second PEL.

6. A spin-transfer torque magnetic random access memory (STTMRAM) element comprising:
a free layer including:
a first and a second free sub-layers having a variable magnetization direction substantially perpendicular to layer planes thereof; and
a first perpendicular enhancement layer (PEL) interposed between the first and second free sub-layers;
a barrier layer formed adjacent to the free layer; and
a reference layer formed adjacent to the barrier layer opposite the free layer, the reference layer including:
a first and a second reference sub-layers having a first invariable magnetization direction;
a second PEL interposed between the first and second reference sub-layers;
an antiferromagnetic coupling layer formed adjacent to the second reference sub-layer opposite the second PEL; and
a third reference sub-layer formed adjacent to the antiferromagnetic coupling layer opposite the second reference sub-layer and having a second invariable magnetization direction that is substantially perpendicular to a layer plane of the third reference sub-layer and opposite to the first invariable magnetization direction,
wherein the first reference sub-layer comprises cobalt, iron, and boron, and
wherein the first and second free sub-layers each comprise cobalt, iron, and boron.

7. A spin-transfer torque magnetic random access memory (STTMRAM) element comprising:
a free layer including:
a first and a second CoFeB free sub-layers having a variable magnetization direction substantially perpendicular to layer planes thereof; and
a first perpendicular enhancement layer (PEL) made of an elemental metal of molybdenum or tungsten interposed between the first and second CoFeB free sub-layers;
a barrier layer formed adjacent to the free layer; and
a reference layer formed adjacent to the barrier layer opposite the free layer, the reference layer including:
a first and a second reference sub-layers having a first invariable magnetization direction substantially perpendicular to layer planes thereof;
a second PEL interposed between the first and second reference sub-layers;
an antiferromagnetic coupling layer formed adjacent to the second reference sub-layer opposite the second PEL; and
a third reference sub-layer formed adjacent to the antiferromagnetic coupling layer opposite the second reference sub-layer and having a second invariable magnetization direction that is substantially perpendicular to a layer plane of the third reference sub-layer and opposite to the first invariable magnetization direction,
wherein the first reference sub-layer comprises cobalt, iron, and boron.

8. The STTMRAM element, as recited in claim 7, wherein the reference layer further includes a spin polarization enhanced layer (SPEL) in physical contact with the barrier layer and the first reference sub-layer comprising cobalt, iron, and boron.

9. The STTMRAM element, as recited in claim 7, wherein the free layer further includes a spin polarization enhanced layer (SPEL) in physical contact with the barrier layer and the first CoFeB free sub-layer.

10. The STTMRAM element, as recited in claim 7, wherein the second PEL is made of an elemental metal selected from tantalum (Ta), titanium (Ti), hafnium (Hf), niobium (Nb), vanadium (V), yttrium (Y), tungsten (W), chromium (Cr), and molybdenum (Mo).

11. The STTMRAM element, as recited in claim 7, wherein the first and second CoFeB free sub-layers are in physical contact with the first PEL.

12. The STTMRAM element, as recited in claim 7, wherein the first and second reference sub-layers are in physical contact with the second PEL.

13. The STTMRAM element, as recited in claim 7, wherein the second reference sub-layer comprises cobalt, iron, and boron.

* * * * *